United States Patent
Ackaret et al.

(10) Patent No.: US 10,327,361 B2
(45) Date of Patent: Jun. 18, 2019

(54) MANAGING AIR TEMPERATURE WITHIN A SERVER RACK

(71) Applicant: LENOVO ENTERPRISE SOLUTIONS (SINGAPORE) PTE. LTD., Singapore (SG)

(72) Inventors: Jerry D. Ackaret, Beaverton, OR (US); Fred A. Bower, III, Durham, NC (US); Gary D. Cudak, Wake Forest, NC (US); Caihong Zhang, Pudong (CN)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/481,912

(22) Filed: Apr. 7, 2017

(65) Prior Publication Data
US 2018/0295753 A1 Oct. 11, 2018

(51) Int. Cl.
*H05K 7/20* (2006.01)

(52) U.S. Cl.
CPC ..... *H05K 7/20836* (2013.01); *H05K 7/20745* (2013.01)

(58) Field of Classification Search
CPC ............ H05K 7/20836; H05K 7/20718

USPC ........................................................ 700/205
See application file for complete search history.

(56) References Cited

U.S. PATENT DOCUMENTS

| | | | | |
|---|---|---|---|---|
| 6,414,843 B1* | 7/2002 | Takeda | ..................... | G06F 1/206 165/121 |
| 6,826,456 B1* | 11/2004 | Irving | ........................ | G06F 1/20 361/695 |
| 2009/0207880 A1* | 8/2009 | Ahladas | .................. | G01K 13/00 374/141 |
| 2012/0300391 A1* | 11/2012 | Keisling | ............ | H05K 7/20745 361/679.46 |
| 2014/0259966 A1* | 9/2014 | Totani | ................. | H05K 7/20136 52/1 |
| 2015/0098180 A1* | 4/2015 | Berghe | ................ | H05K 7/20736 361/679.48 |
| 2015/0338281 A1* | 11/2015 | Ross | ........................ | G01K 3/14 236/44 A |

* cited by examiner

*Primary Examiner* — Ziaul Karim

(57) ABSTRACT

Managing thermal cycles of air temperature within a server rack includes: monitoring air temperature within the server rack; determining that the monitored temperature has fallen below a predetermined minimum threshold; and increasing air temperature within the server rack including capturing warm ambient air.

11 Claims, 5 Drawing Sheets

MANAGING AIR TEMPERATURE WITHIN A SERVER RACK

BACKGROUND

Field

The field of the present disclosure is data processing, or, more specifically, methods, apparatus, and products for managing thermal cycles of air temperature within a server rack.

Description of Related Art

Thermal expansion and contraction of materials in a server can cause stress on joints between parts with differing material composition. This stress requires designers to use more material to ensure that the thermal cycles do not result in a break in a connection between parts over the designed lifetime of the system. This results in extra cost in the system. In sub-standard designs, system parts may wear out earlier, netting a cost savings in acquisition, but resulting in a shorter lifetime of the server.

SUMMARY

Methods, apparatus, and products of managing thermal cycles of air temperature within a server rack are disclosed in this specification. Such management of thermal cycles of air temperature within a server rack include: monitoring air temperature within the server rack; determining that the monitored temperature has fallen below a predetermined minimum threshold; and increasing air temperature within the server rack including capturing warm ambient air.

The foregoing and other objects, features and advantages of the present disclosure will be apparent from the following more particular descriptions of exemplary embodiments of the present disclosure as illustrated in the accompanying drawings wherein like reference numbers generally represent like parts of exemplary embodiments of the present disclosure.

DETAILED DESCRIPTION

Figure 1:
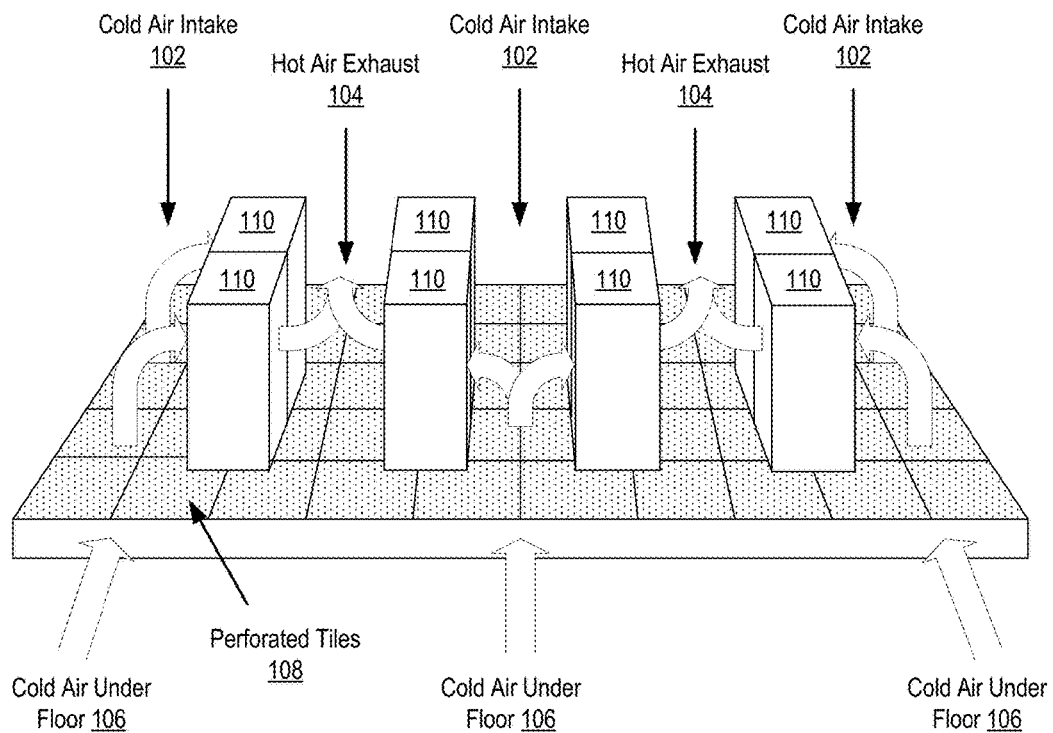
FIG. 1 sets forth a drawing of an example data center.

Exemplary methods, apparatus, and products for managing thermal cycles of air temperature within a server rack in accordance with the present disclosure are described with reference to the accompanying drawings, beginning with FIG. 1. FIG. 1 sets forth a drawing of an example data center. The example data center of FIG. 1 includes a number of server racks (110) aligned in aisles. The server racks (110) sit on a floor formed of perforated floor tiles (108). Cold air (106) flows beneath the perforated tiles, and up through the perforations. Generally, one side of the aisle of server racks is configured for cold air intake (102). That is, fans on the servers, server racks, in the ceiling of the example data center, and so on, pull cold air from the perforated tiles on one side of the aisle of server racks. By contrast, the opposing side of the aisle of server racks is configured for hot air exhaust. That is, fans in the servers and server racks force hot air out along the non-cold air side of the server rack aisle. Two parallel aisles of server racks may share a hot air exhaust (104) path or cold air intake (102) path. Fans installed on a far end of the aisles may be configured to pull the hot air exhaust away out of the space between two aisles.

In current systems, servers and server racks are generally configured to cool as much as possible as often as possible. Due to variations in workload over time and the constant attempt to cool the servers in the server racks, thermal cycles often occur. Such a thermal cycle is a variation of temperature from one high threshold to a low threshold, where such thresholds represent temperature tolerances of a component in a server. When the cycle occurs, the component of a server may experience degradation. Over time, such degradation may lead to failure.

To that end, the system of FIG. 1 may include one or more management modules that manage thermal cycles of air temperature within the server racks (110). A management module configured for such thermal cycle management may: determine monitoring air temperature within a server rack; determine that the monitored temperature has fallen below a predetermined minimum threshold; and increase air temperature within the server by capturing warm ambient air. In some embodiments, the warm ambient air may be exhaust air from one or more other server racks. The 'minimum threshold' here refers to a temperature above that of the minimum temperature tolerance of the components within the server rack. In this way, the temperature in the server rack remains above such minimum temperature tolerance of the components within the server rack. Said another way, the temperature within the server rack, by staying warm, never varies enough to complete a full thermal cycle and the components do not experience such a thermal cycle.

Figure 2:
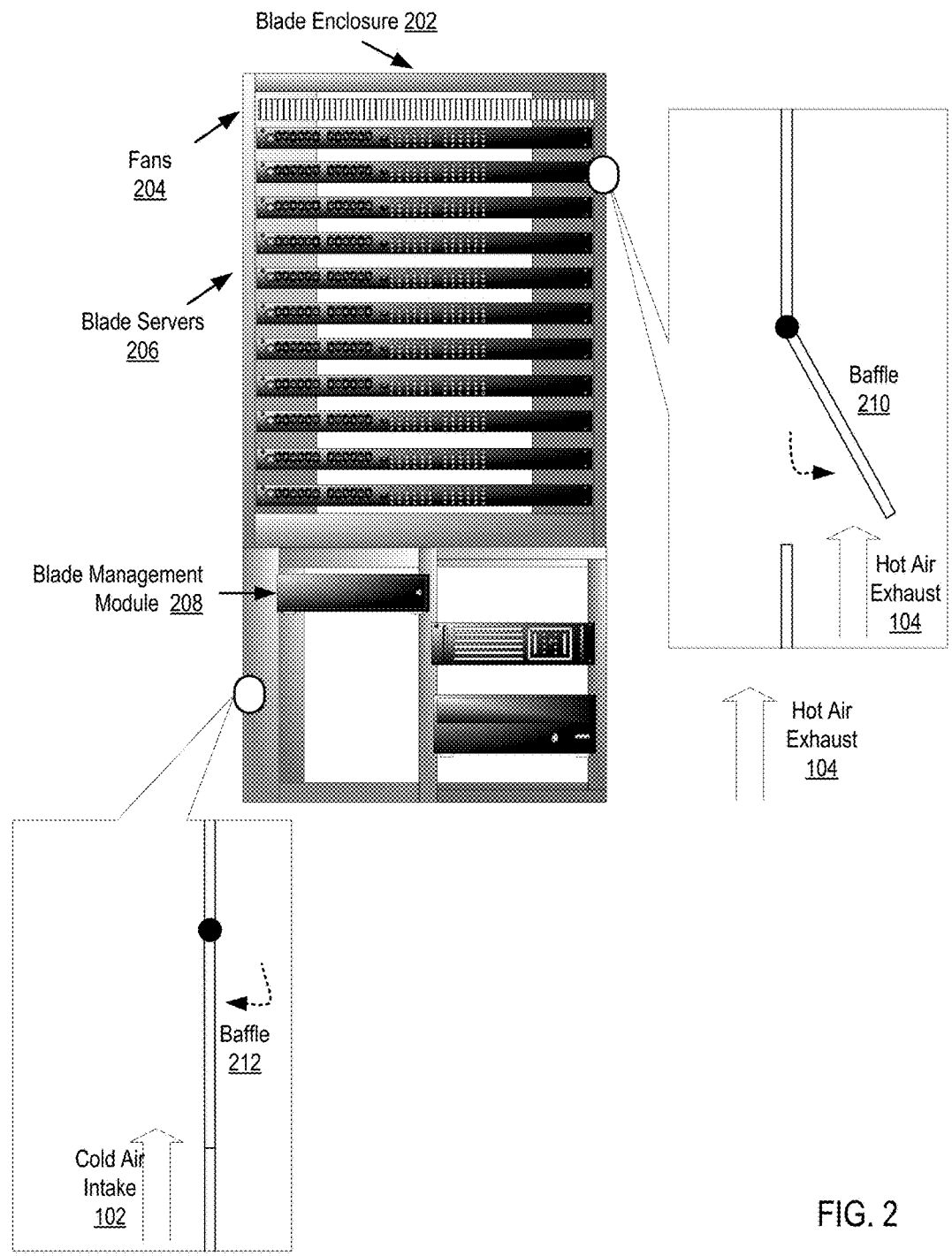
FIG. 2 sets forth an example server rack in the form of a blade enclosure.

For further explanation, FIG. 2 sets forth an example server rack in the form of a blade enclosure (202). The example blade enclosure (202) includes a number of blade servers (206). A blade server is a stripped-down server computer with a modular design optimized to minimize the use of physical space and energy. Blade servers have many components removed to save space, minimize power consumption and other considerations, while still having all the functional components to be considered a computer. Unlike a traditional rack-mount server, a blade server is housed in a blade enclosure, which can hold multiple blade servers, providing services such as power, cooling, networking, various interconnects and management. Together, blades and the blade enclosure form a blade system.

The example blade enclosure (202) of FIG. 2 also includes fans (204), a cold air intake (102) baffle (212), and a hot air exhaust (104) baffle (210). Each of the baffles (210, 212) may pivot at the control of a blade management module (208).

The blade management module (208) of FIG. 2 may monitor and control various environmental and operational aspects of the blade enclosure (202) and the blade servers (206) within the enclosure (202). The blade management module (208) may also, in this example, manage thermal cycles in the blade enclosure (202). The blade management module (208) may, through communication with one or more service processors or sensors in the servers (206) or enclosure (202) itself, monitor air temperature within the server rack. The blade management module (208) may then determine whether the monitored temperature has fallen below a predetermined minimum threshold. When the monitored temperature does fall below the predetermined minimum threshold, the blade management module (208) may increase the air temperature within the server rack by capturing warm ambient air such as exhaust air from one or more other server racks.

In the example of FIG. 2, the blade management module may capture warm ambient air, such exhaust air from other server racks (or blade enclosures in this example), by adjusting the cold air intake (102) baffle (212) to block incoming cold airflow (102) and adjusting the hot air exhaust (104) baffle to receive hot air (104) as intake.

To increase the temperature in the blade enclosure (202), the blade management module may also reverse or halt operation of one or more fans (204). In the example of FIG. 2, the fans (204), in normal operation, may be configured to pull cold air intake in and exhaust hot air out. In such an example, the blade management module may increase temperature in the blade enclosure (202) by reversing or ceasing the operation of the fans (204), thus ceasing the pull of cold air intake. Readers of skill in the art will recognize that some fans may be installed in the server rack at other physical locations than those (204) set forth in the example of FIG. 2. For example, a fan or fans may be installed solely to exhaust hot air, along the side of the enclosure facing the hot air aisle. Such fans may be reversed from exhausting hot air to intaking hot air to increase the temperature within the blade enclosure.

Once the temperature rises to meet a predetermined maximum threshold (set below the maximum temperature tolerance of the components of the server rack), the blade management module may resume normal cooling and airflow operation. In essence, the blade management module ensures that the blade server rack never experiences a full thermal cycle—never allowing the temperature to fall too low or raise too high.

Figure 3:
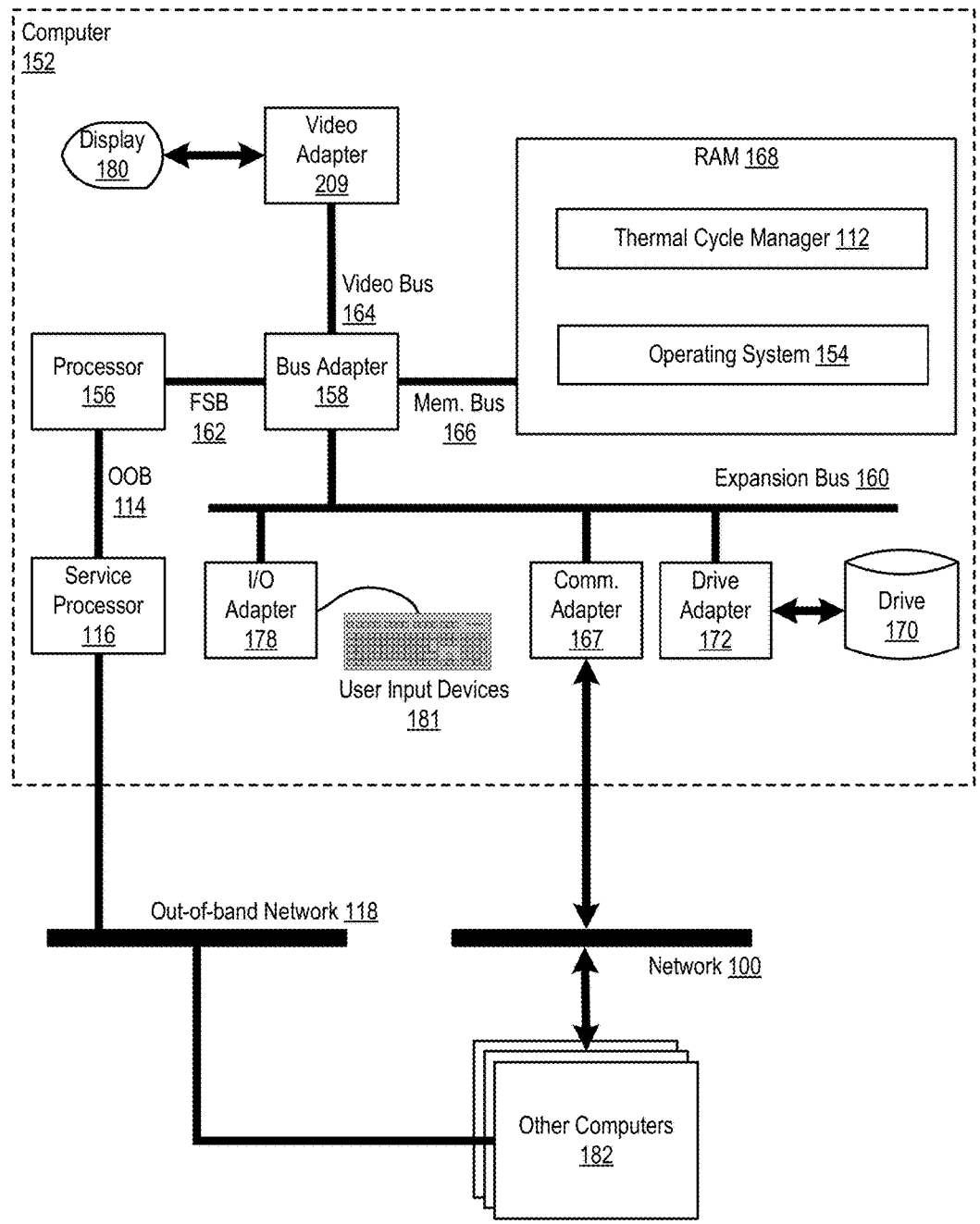
FIG. 3 includes a block diagram of example automated computing machinery configured for managing thermal cycles of air temperature within a server rack according to embodiments of the present disclosure.

For further explanation, the system of FIG. 3 includes a block diagram of example automated computing machinery configured for managing thermal cycles of air temperature within a server rack according to embodiments of the present disclosure. The example automated computing machinery of FIG. 3 is implemented in the form of a computer system (152). The computer system (152) may be implemented as a server installed in the rack and may take the role of a management module for a rack of servers, a management module for a group of racks, or a server within a rack of servers that has control over temperature control components of the rack.

The computer (152) of FIG. 3 includes at least one computer processor (156) or 'CPU' as well as random access memory (168) ('RAM') which is connected through a high speed memory bus (166) and bus adapter (158) to processor (156) and to other components of the computer (152).

Stored in RAM (168) is a thermal cycle manger (112), a module of computer program instructions for thermal cycle management in accordance with embodiments of the present disclosure. The example thermal cycle manager (112) may manage thermal cycles within a rack by monitoring air temperature within the server rack; determining that the monitored temperature has fallen below a predetermined minimum threshold; and increasing air temperature within the server rack including capturing warm ambient air, such as exhaust air from one or more other server racks. Such monitoring of the air temperature may be carried by polling a service processor (116) or by receiving reports from the service processor (116) regarding temperature measurements. The service processor (116) in the example of FIG. 1 may be coupled to the processor (156) through an out-of-band bus (114) and to other components in the computer (152) through similar out-of-band busses (114). The service processor (116) may monitor various environmental conditions, such as temperature, of various components and collect measurements from various monitoring components installed in the rack and the computer (152). In some embodiments, rather than the thermal cycle manager (112) being stored in RAM (168) and thus executed by processor (156), the thermal cycle manager (112) may be stored in firmware accessible to the service processor (116) or otherwise programmed into the service processor (116). The service processor (116) may be coupled to other service processors of other computers (182) (installed in the same rack or other racks) or to a management module through an out-of-band bus network (118). In such an embodiment, the thermal cycle manager (112) may be executed by a management module separate from the rack in which the computer (152) is installed and the service processor (116) may report temperature measurements to the management module.

Also stored in RAM (168) is an operating system (154). Operating systems useful in computers configured for managing thermal cycles of air temperature within a server rack according to embodiments of the present disclosure include UNIX™, Linux™, Microsoft Windows™, AIX™, IBM's iOS™, and others as will occur to those of skill in the art. The operating system (154) and thermal cycle manager (112) in the example of FIG. 3 are shown in RAM (168), but many components of such software typically are stored in non-volatile memory also, such as, for example, on a disk drive (170).

The computer (152) of FIG. 3 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers configured for managing thermal cycles of air temperature within a server rack according to embodiments of the present disclosure include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 3 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 3 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computer (152) of FIG. 3 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for managing thermal cycles of air temperature within a server rack according to embodiments of the present disclosure include modems for wired dial-up communications, Ethernet (IEEE 802.3) adapters for wired data communications, and 802.11 adapters for wireless data communications.

The arrangement of servers and other devices making up the exemplary system illustrated in FIG. 1 are for explanation, not for limitation. Data processing systems useful according to various embodiments of the present disclosure may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present disclosure may be implemented on a variety of hardware platforms in addition to those illustrated in FIG. 1.

Figure 4:
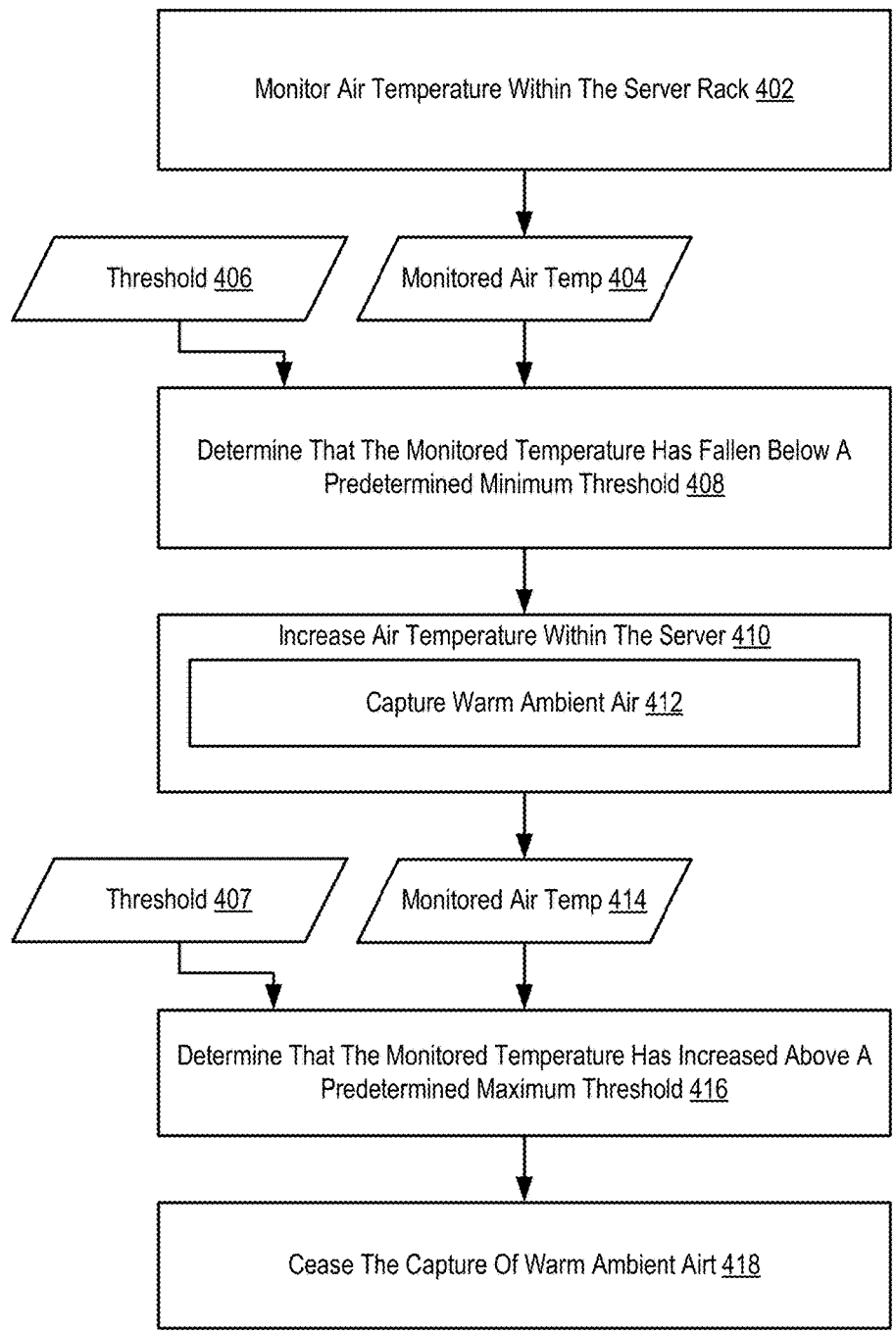
FIG. 4 sets forth a flow chart illustrating an exemplary method for managing thermal cycles of air temperature within a server rack according to embodiments of the present disclosure.

For further explanation, FIG. 4 sets forth a flow chart illustrating an exemplary method for managing thermal cycles of air temperature within a server rack according to embodiments of the present disclosure. The method of FIG. 4 includes monitoring (402) air temperature (404) within the server rack. Monitoring (402) air temperature (404) within the server rack may be carried out by collecting temperature measurements from various components within the rack.

The method of FIG. 2 continues by determining (408) that the monitored temperature has fallen below a predetermined minimum threshold (406). The predetermined threshold represents a temperature above the minimum temperature of a thermal cycle. Once the monitored temperature reaches the predetermined minimum threshold (406), the server rack may experience a thermal cycle without intervention.

To that end, the method of FIG. 4 includes increasing (410) air temperature within the server rack. In the method of FIG. 4, increasing (410) air temperature within the server rack is carried out by capturing (412) warm ambient air, such as exhaust air from one or more other server racks.

The method of FIG. 4 also includes determining (416) that the monitored temperature (414) has increased above a predetermined maximum threshold (407). The predetermined maximum threshold (407) is a temperature above which components within the server rack may be negatively affected—a maximum temperature tolerance of the components.

To that end, the method of FIG. 4 continues by ceasing (418) the capture of warm ambient air, such as exhaust air from one or more other server racks. In addition to ceasing (418) the capture of warm exhaust air, the method may also include implementing one or more cooling actions within the server rack including any combination of increasing fan speed for exhaust of hot air, increasing fan speed for intake of cold air, altering baffle position to capture cold air intake and the like.

Figure 5:
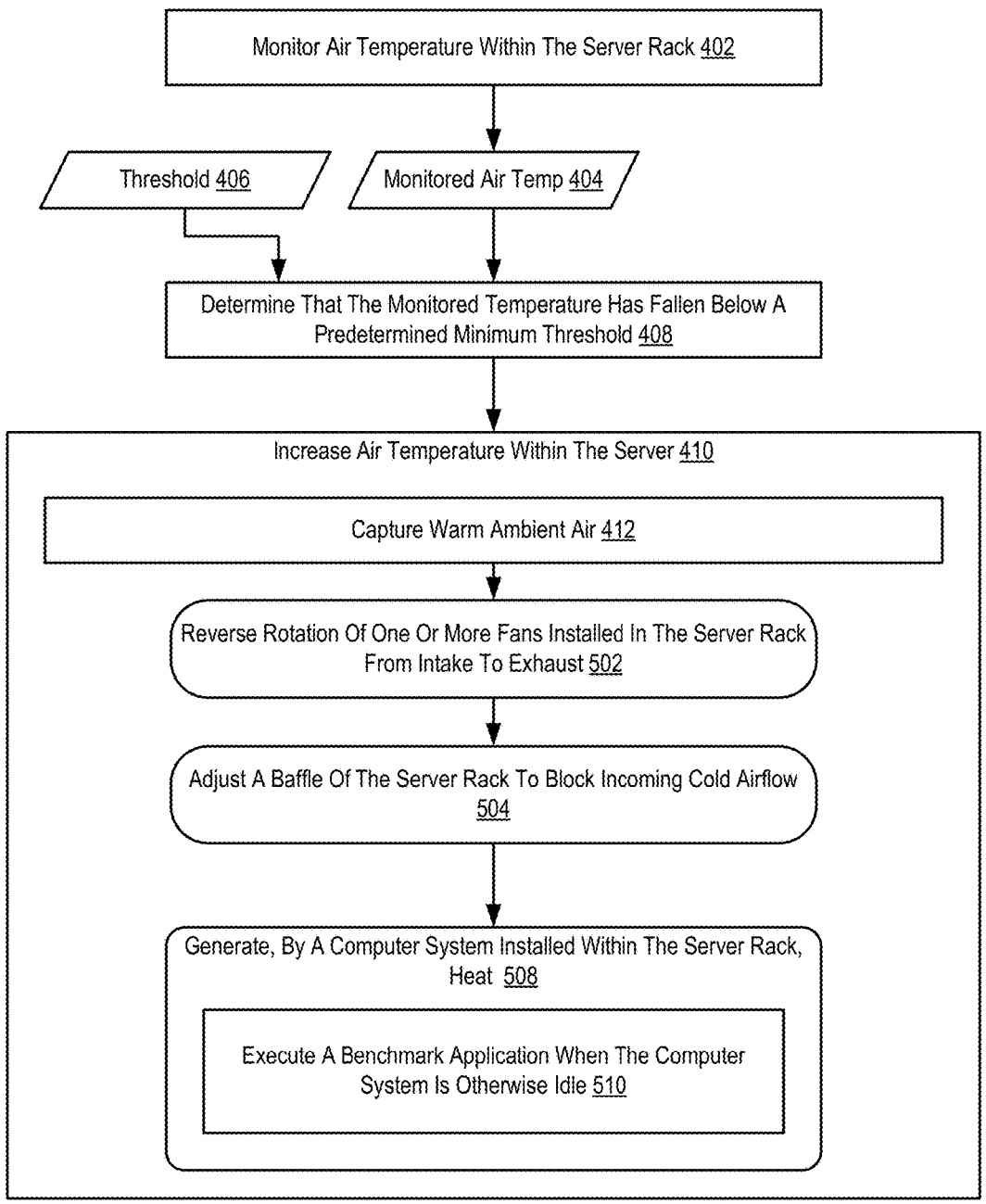
FIG. 5 sets forth a flow chart illustrating a further exemplary method for managing thermal cycles of air temperature within a server rack according to embodiments of the present disclosure.

For further explanation, FIG. 5 sets forth a flow chart illustrating a further exemplary method for managing thermal cycles of air temperature within a server rack according to embodiments of the present disclosure. The method of FIG. 5 is similar to the method of FIG. 4 in that the method of FIG. 5 also includes: monitoring (402) air temperature (404) within the server rack; determining (408) that the monitored temperature (404) has fallen below a predetermined minimum threshold (406); and increasing (410) air temperature within the server rack including capturing (412) warm ambient air, such as exhaust air from one or more other server racks.

The method of FIG. 5 differs from the method of FIG. 4, however, in that in the method of FIG. 5, increasing (410) air temperature within the server rack also includes reversing (502) rotation of one or more fans installed in the server rack from intake to exhaust and adjusting (504) a baffle of the server rack to block incoming cold airflow. Readers of skill in the art will recognize that either or both methods of increasing air temperature may be implemented in various embodiments. In this manner, cold air intake is blocked in two ways. First, the fans normally operating to intake cold air reversed (or otherwise shut down). Second, a cold air baffle that is normally adjusted to allow intake of cold air is adjusted to block such cold air intake. In this way, the server rack's temperature may increase by both capturing warm air exhaust from neighboring server racks (by opening a baffle, or reversing fans to intake hot air rather than exhaust hot air) and blocking any incoming cold air.

Also in the method of FIG. 5, increasing (410) air temperature within the server may include generating (508), by a computer system installed within the server rack, heat. Such generation may be carried out as a result of an instruction or request provided by a management module carrying out the method of FIG. 5. In the method of FIG. 5, generating heat by a computer system installed in a server rack is carried out by executing (510) a benchmark application when the computer system is otherwise idle. A management module carrying out thermal cycle management of FIG. 5 may either be aware of the current workload distribution amongst computers within the server rack or may poll the computers to determine the current workload. For those computers that are otherwise idle (that is, not currently executing a workload), the management module may request or deploy a bench mark application to the computer. The computer, upon executing the benchmark application, may generate heat. The benchmark itself may be selected for its particular ability to generate heat when executed.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present disclosure without departing from its true spirit. The descriptions in this specification are for purposes of illustration only and are not to be construed in a limiting sense. The scope of the present disclosure is limited only by the language of the following claims.

What is claimed is:

1. A method comprising:
   by program instructions on a computing device,
   monitoring air temperature within a server rack comprising a plurality of components mounted therein, the server rack further comprising one or more fans and a cold air intake baffle, the cold air intake baffle located adjacent to a perforated floor upon which the server rack sits, and through which cold intake air flows;
   comparing the monitored air temperature with a minimum threshold temperature for the server rack that is predetermined based on respective minimum temperature tolerances of each of the plurality of components, below which component degradation occurs;

determining that the monitored temperature has fallen below the minimum threshold temperature; and increasing the air temperature within the server rack by reversing rotation of at least one of the one or more fans from intake to exhaust and by adjusting the cold air intake baffle to block incoming cold airflow, wherein increasing the air temperature within the server rack mitigates an occurrence of a thermal cycle of air temperature within the server rack, the thermal cycle comprising a variation of the air temperature within the server rack from a value below the minimum threshold temperature to a value above a maximum threshold temperature for the server rack that is predetermined based on respective maximum temperature tolerances of each of the plurality of components in the server rack.

2. The method of claim 1 wherein increasing air temperature within the server rack further comprises reversing rotation of one or more fans installed in the server rack from exhaust to intake.

3. The method of claim 1 wherein increasing air temperature within the server rack further comprises adjusting a baffle of the server rack to block exhaust hot airflow.

4. The method of claim 1 further comprising:
generating, by a computer system installed within the server rack, heat including executing a benchmark application when the computer system is otherwise idle.

5. The method of claim 1 further comprising:
determining that the monitored temperature has increased above the maximum threshold temperature; and
reversing rotation of the at least one of the one or more fans from exhaust back to intake and adjusting the cold air intake baffle to allow incoming cold airflow.

6. An apparatus comprising a computer processor, a computer memory operatively coupled to the computer processor, the computer memory including computer program instructions to:
monitor air temperature within a server rack comprising a plurality of components mounted therein, the server rack further comprising one or more fans and a cold air intake baffle, the cold air intake baffle located adjacent to a perforated floor upon which the server rack sits, and through which cold intake air flows;
compare the monitored air temperature with a minimum threshold temperature for the server rack that is predetermined based on respective minimum temperature tolerances of each of the plurality of components, below which component degradation occurs;
determine that the monitored temperature has fallen below the minimum threshold temperature; and
increase the air temperature within the server rack by reversing rotation of at least one of the one or more fans from intake to exhaust and by adjusting the cold air intake baffle to block incoming cold airflow,
wherein increasing the air temperature within the server rack mitigates an occurrence of a thermal cycle of air temperature within the server rack, the thermal cycle comprising a variation of the air temperature within the server rack from a value below the minimum threshold temperature to a value above a maximum threshold temperature for the server rack that is predetermined based on respective maximum temperature tolerances of each of the plurality of components in the server rack.

7. The apparatus of claim 6 further comprising computer program instructions to generate, by a computer system installed within the server rack, heat including executing a benchmark application when the computer system is otherwise idle.

8. The apparatus of claim 6 further comprising computer program instructions to:
determine that the monitored temperature has increased above the maximum threshold temperature; and
reverse rotation of the at least one of the one or more fans from exhaust back to intake and adjust the cold air intake baffle to allow incoming cold airflow.

9. A computer program product disposed upon a computer readable medium that is not a transient signal, the computer program product comprising computer program instructions to:
monitor air temperature within a server rack comprising a plurality of components mounted therein, the server rack further comprising one or more fans and a cold air intake baffle, the cold air intake baffle located adjacent to a perforated floor upon which the server rack sits, and through which cold intake air flows;
comparing the monitored air temperature with a minimum threshold temperature for the server rack that is predetermined based on respective minimum temperature tolerances of each of the plurality of components, below which component degradation occurs;
determine that the monitored temperature has fallen below the minimum threshold temperature; and
increase the air temperature within the server rack by reversing rotation of at least one of the one or more fans from intake to exhaust and by adjusting the cold air intake baffle to block incoming cold airflow,
wherein increasing the air temperature within the server rack mitigates an occurrence of a thermal cycle of air temperature within the server rack, the thermal cycle comprising a variation of the air temperature within the server rack from a value below the minimum threshold temperature to a value above a maximum threshold temperature for the server rack that is predetermined based on respective maximum temperature tolerances of each of the plurality of components in the server rack.

10. The computer program product of claim 9 further comprising computer program instructions to generate, by a computer system installed within the server rack, heat including executing a benchmark application when the computer system is otherwise idle.

11. The computer program product of claim 9 further comprising computer program instructions to:
determine that the monitored temperature has increased above the maximum threshold temperature; and
reverse rotation of the at least one of the one or more fans from exhaust back to intake and adjust the cold air intake baffle to allow incoming cold airflow.

* * * * *